(12) United States Patent
Kuo et al.

(10) Patent No.: US 7,027,332 B2
(45) Date of Patent: Apr. 11, 2006

(54) MEMORY I/O DRIVING CIRCUIT WITH REDUCED NOISE AND DRIVING METHOD

(75) Inventors: Sheng-Chang Kuo, Miaoli (TW); Jhyy-Cheng Liou, Jhubei (TW); Ting-Chung Hu, Taipei (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 10/846,746

(22) Filed: May 13, 2004

(65) Prior Publication Data
US 2005/0254312 A1  Nov. 17, 2005

(51) Int. Cl.
*G11C 7/00* (2006.01)

(52) U.S. Cl. .................. 365/189.05; 365/191; 326/83; 326/86; 327/108; 327/112

(58) Field of Classification Search .......... 365/189.05, 365/191; 326/26, 27, 57, 58, 83, 86, 87, 326/108, 112
See application file for complete search history.

(56) References Cited

U.S. PATENT DOCUMENTS

| | | | |
|---|---|---|---|
| 4,779,013 A * | 10/1988 | Tanaka | 326/27 |
| 5,497,113 A * | 3/1996 | Uber | 327/170 |
| 5,539,341 A * | 7/1996 | Kuo | 327/108 |
| 5,670,894 A * | 9/1997 | Takaishi et al. | 326/27 |
| 6,411,120 B1 * | 6/2002 | Hung et al. | 326/27 |

* cited by examiner

*Primary Examiner*—Son Mai
(74) *Attorney, Agent, or Firm*—J.C. Patents

(57) ABSTRACT

A memory driving circuit has a register for receiving a new-coming data and a delayed clock, and exporting a current-existing data. The delayed clock has a delay to a clock. A pre-detecting circuit receives the current-existing data, the new-coming data, and a pre-enable signal, and exports an output signal. Wherein, the current-existing data is compared with the new-coming data. The output signal indicates a disable state if the two data are the same. Otherwise, the output signal indicates an enable state, wherein the pre-enable signal is also used to enable or disable the pre-detecting circuit. An output driving circuit receives the current-existing data and an enabling signal, and exports a first output signal. A pre-driving circuit receives the output signal of the pre-detecting circuit and an enable control signal, and exports a second output signal. An I/O pad receives the first output signal and the second output signal.

9 Claims, 9 Drawing Sheets

_US 7,027,332 B2_

MEMORY I/O DRIVING CIRCUIT WITH REDUCED NOISE AND DRIVING METHOD

BACKGROUND OF THE INVENTION

1. Field of Invention

The present invention relates to memory I/O driver. More particularly, the present invention relates to a high-speed memory I/O driver with reduced noise.

2. Description of Related Art

Memory device has been widely used to store the information. The nonvolatile memory device can store information in a sufficient long period even when the power is off. When the multimedia industry has been well developed, memory card, which is a kind of portable memory device, has been widely used in current daily life to store information and transfer the information. Many newly developed digital apparatus, such as digital camera or computer, use the memory card to store multimedia information.

Usually, the digital device only adapts one memory card. However, when the amount of information greatly increases, the digital apparatus may adapt multiple I/O memory cards. When multiple memory cards are used, the driver needs to have high I/O speed to drive the memory cards. However, the I/O transient current is a big source of noise. The conventional driving circuit is shown in FIG. 1. The register 100 receives the data and the complimentary clock CLKB and then shifts the data to the output driver (OUTDRV) 102, which is controlled by an enable signal, OEB. The output of the driver 102 is exported to the I/O pad 104 with a voltage level with respect to the data. Then, the connected apparatus can read the data according to the voltage level on the pad 104. In addition, due to the circuit loop, there is an equivalent capacitor load (Cload) 106, exiting between the pad 104 and the system voltage Vss, such as a ground voltage.

FIG. 2 is a time diagram, schematically the relation between clock, data, and pad voltage, according to the conventional driving circuit in FIG. 1. Basically, the data as indicated by A is shifted out from the register 100, and is sent to the I/O pad 104 with amplification by the driver 102. Since the circuit has the loading capacitor 106 and the equivalent impedance, the waveform of data signal on I/O pad has slopes on the rising edge and/or the falling edge. Also, the time response is not precisely following the signal A. As a result, when the data signal on the I/O pad is read out at the falling edge of the clock CLK, due to the data setup time from PAD to the next rising edge of the clock CLK, a strong driving capability is needed, power and Vss bounce may induce the noises and the data would be erroneous. This error is more often when multiple memory cards or multiple I/O pads in a memory card are adapted together.

When at least considering above conventional issues or some other potential issues, the conventional memory-card driver is necessary to be further developed.

SUMMARY OF THE INVENTION

The invention provides a memory I/O driving circuit capable of at least reducing the noise level when multiple I/O pad in a memory card are driven together.

The invention provides a memory I/O driving circuit, which includes a register for receiving a new-coming data and a delayed clock, and exporting a current-existing data. The delayed clock has a delay to a clock. A pre-detecting circuit receives the current-existing data, the new-coming data, and a pre-enable signal, and exports an output signal. Wherein, the current-existing data is compared with the new-coming data. The output signal indicates a disable state if the two data are the same. Otherwise, the output signal indicates an enable state, wherein the pre-enable signal is also used to enable or disable the pre-detecting circuit. An output driving circuit receives the current-existing data and an enabling signal, and exports a first output signal. A pre-driving circuit receives the output signal of the pre-detecting circuit and the new-coming data, and exports a second output signal. The first output signal and the second output signal are to be sent to an I/O pad.

Alternatively, at least in order to reducing noise and reading errors, the invention provides a memory I/O driving circuit, suitable for use to drive multiple memory cards. The memory I/O driving circuit comprises a main driving circuit, to send data signal to I/O pad according to a time sequence, wherein the data signal has a rising edge and a falling edge. A pre-driving circuit is coupled with the main driving circuit, so as to change each of the rising edge and the falling edge into a first edge part and a second edge part. As a result, the first edge part within a holding time period is more approaching to being horizontal than the second edge part. In other words, the absolute slope for the first edge part is more horizontal.

Alternatively, the invention also provides a memory I/O driving method. The method comprises sending a data signal with a rising edge and a falling edge to an I/O pad in a time sequence, and changing each of the rising edge and the falling edge into a first edge part and a second edge part. Wherein, the first edge part within a holding time period is more approaching to being horizontal than the second edge part.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a novel memory I/O driving circuit is proposed. In the present invention, a pre-driving circuit is used to at least adjust the rising edge and the falling edge of the data signal at the I/O pad. Due to the pre-driving effect, the signal edges at the first part have been adjusted to be more horizontal. This at least allows the data to be kept longer with more hold time with reduced errors if the host timing is shifted.

Figure 3:
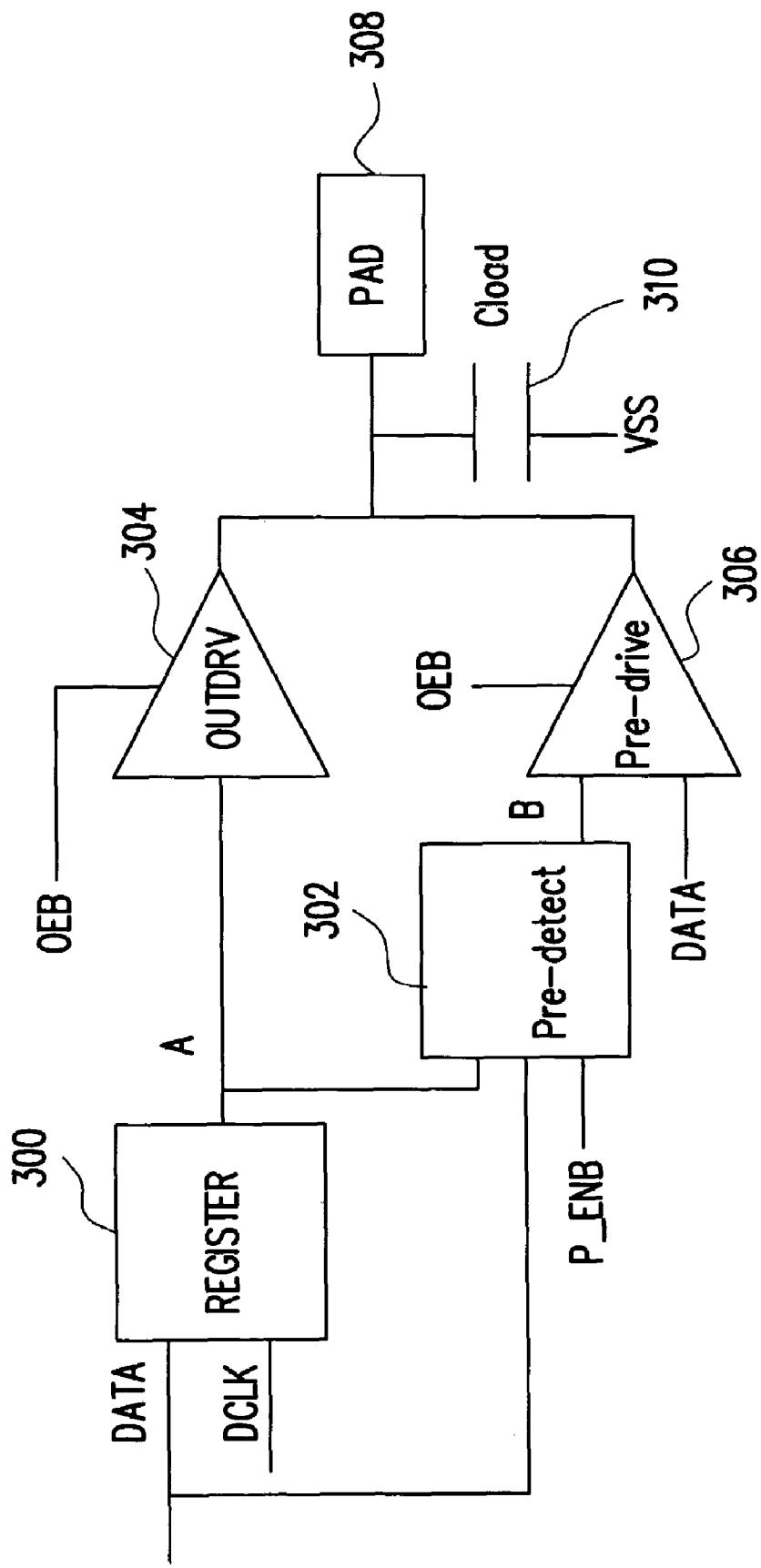
FIG. 3 is block diagram, schematically illustrating the memory-card driving circuit for driving multiple I/O pads in a memory card, according to an embodiment of the invention.

FIG. 3 is block diagram, schematically illustrating the memory-card driving circuit for driving multiple I/O pads in a memory card, according to an embodiment of the invention. In FIG. 3, the memory-card driving circuit of the invention includes a register 300, a pre-detecting circuit 302, an output driving circuit (OUTDRV) 304, and a pre-driving circuit 306. In addition, an I/O pad 308 is coupled to the output terminals of the output driving circuit (OUTDRV) 304 and the pre-driving circuit 306. However, a load capacitor 310 and a circuit load impedance (not shown) is between the pad 308 and a system low voltage source, such as a ground voltage VSS.

The register 300 receives the data (DATA) and a delayed clock (DCLK). The delayed clock has a delay to a clock (CLK). Then, the data is shifted out as the signal A. The signal A and the data (DATA) are sent to the pre-detecting circuit 302, which is also controlled by the enable signal P_ENB. At the same time, the signal A is sent to the output driver 304. The output driver 304 can be similar to the conventional driver and is controlled by the enable signal OEB. Then, the output signal is sent to the I/O pad 308.

Figure 1:
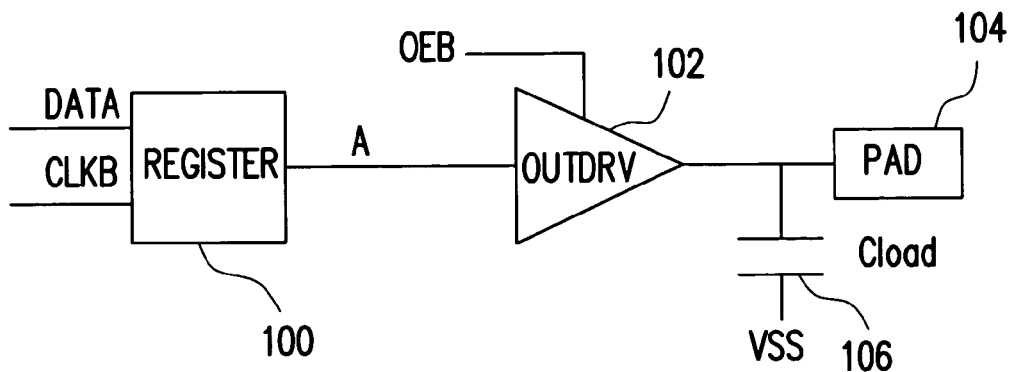
FIG. 1 is a block diagram, schematically illustrating a conventional memory-card driving circuit for driving multiple memory cards.
Figure 2:
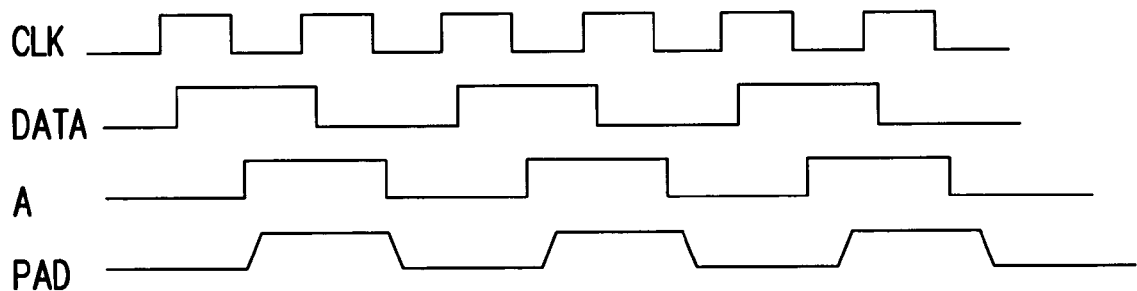
FIG. 2 is a time diagram, schematically illustrating the time relation for the data being sent to the I/O pad for the conventional circuit in FIG. 1.
Figure 4:
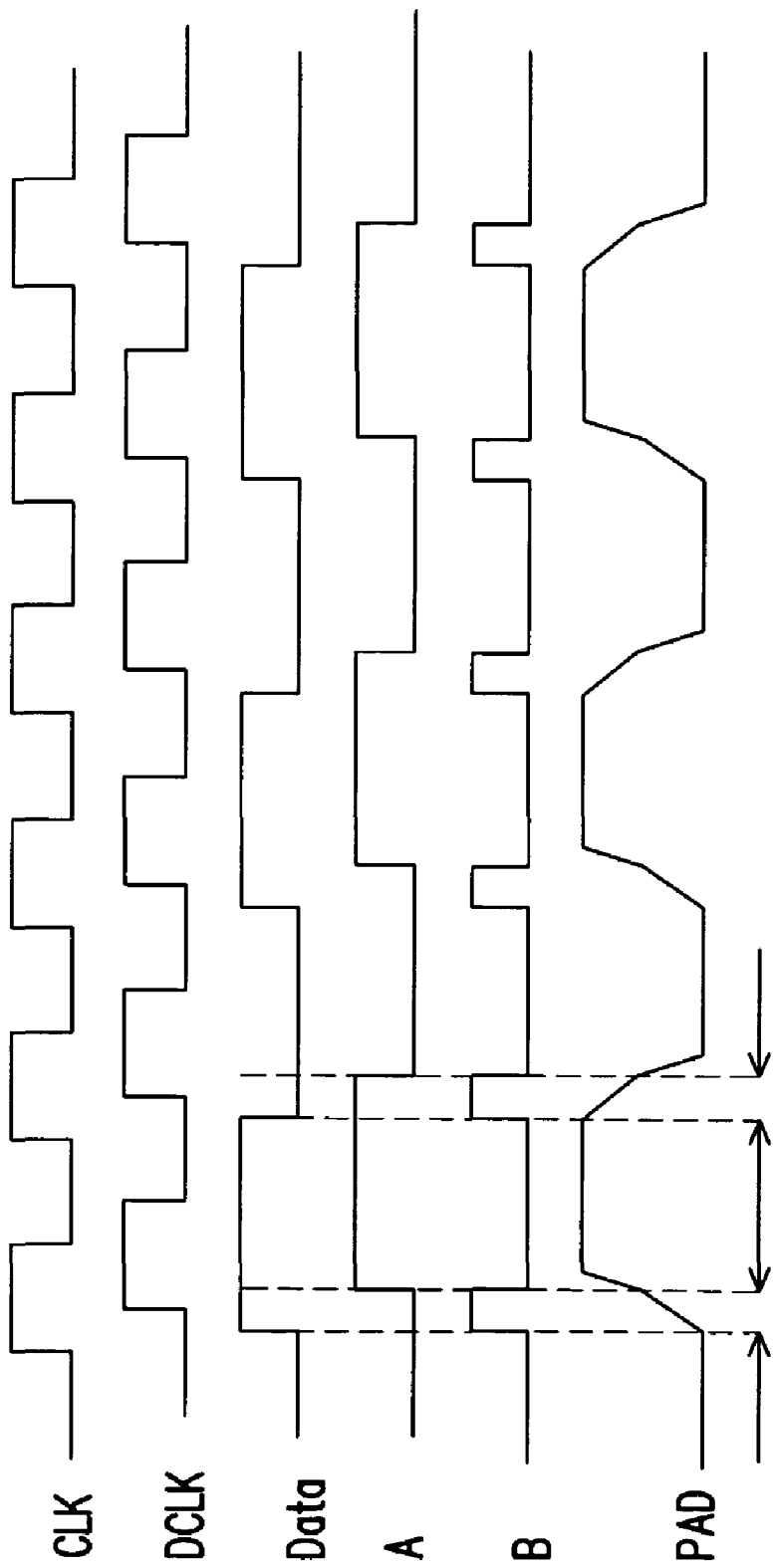
FIG. 4 is a time diagram, schematically illustrating the time relation for the data being sent to the I/O pad for the circuit in FIG. 3.

Also referring to FIG. 4, in the invention, the pre-detecting circuit 302 compares the new-coming data signal DATA and the currently-existing data, indicated by signal A, and then exports the signal B. The signal B is fed to the pre-driving circuit 306. For the signal B, when the currently-existing data and the new-coming data are the same, then the pre-driving circuit 306 is disabled, such as a low level. Otherwise, the pre-driving circuit 306 is enabled, such as high level, to pre-drive the new-coming data after the rising edge of the clock CLK. However, the control signal P_ENB can enable or disable the pre-detecting circuit 302. When the pre-detecting circuit 302 is disabled, the pre-driving circuit 306 becomes the high-impedance state. In other words, the pre-driving circuit 306 is off and the data is driven similar to the conventional way as shown in FIG. 1.

The pre-driving circuit 306 can also receive the DATA in operation, and is controlled by the enable signal OEB. The output terminals of the output driver 304 and the pre-driving circuit 306 are coupled together to a common node. The load capacitor 310 exists between the pad 308 and the system low voltage Vss. The common node is, for example, the I/O pad 308. When the pre-diving circuit 306 is enabled, the circuit provides an output impedance, which is incorporated with the output impedance from the output driver 304. As a result, the total impedance is changed. According to the properties of RC circuit, the slopes of the rising edge and the falling data for the signal arriving at the I/O pad 308. The slope change can be seen in FIG. 4. As a result, the rising edge or the falling edge has two edge parts. The first edge part, within a time period, has the absolute slope, more closing to the horizontal level. When the pre-driving circuit 306 is disabled, the RC constant for the circuit returns back to the original setting.

Therefore, when the voltage level on the pad 308 is read, for example, at the falling edge of the clock CLK, the data can be held by the time period. Even if the timing has been shifted a little, the data still can be possibly read with reduced error.

Figure 5:
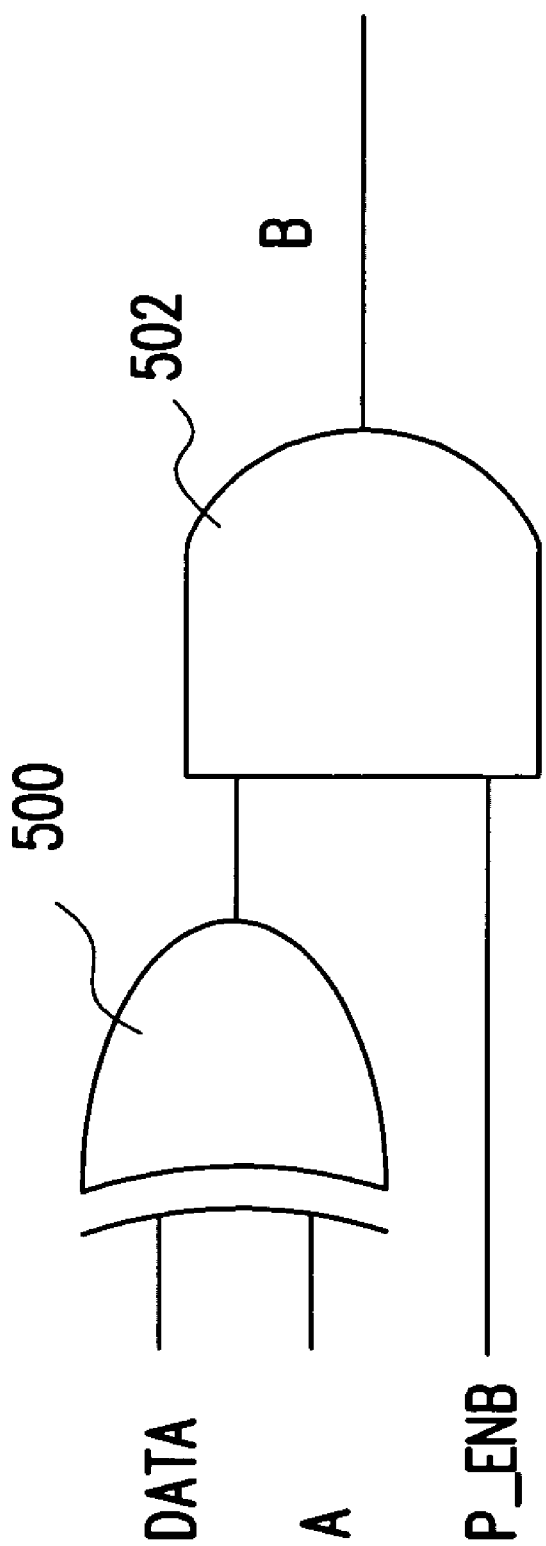
FIG. 5 is a circuit diagram, schematically illustrating the pre-detecting circuit in FIG. 3, according to an embodiment of the invention.

For the circuit in FIG. 3, the pre-detecting circuit 302 can be implemented by a circuit, such as the circuit in FIG. 5. In FIG. 5, the pre-detecting circuit 302 may include an XOR (exclusive OR) logic gate 500 and an AND logic gate 502, wherein the XOR logic gate 500 can be replaced by XNOR (exclusive NOR) logic gate in an equivalent operation. The XOR logic gate 500 is the example for descriptions. The XOR logic gate 500 receives the data DATA and the signal A. The output of the XOR logic gate 500 is exported to the AND logic gate 502 while the control signal P_ENG is also fed for controlling the pre-detecting circuit 302. The AND logic gate 502 then exports the signal B.

Figure 6A:
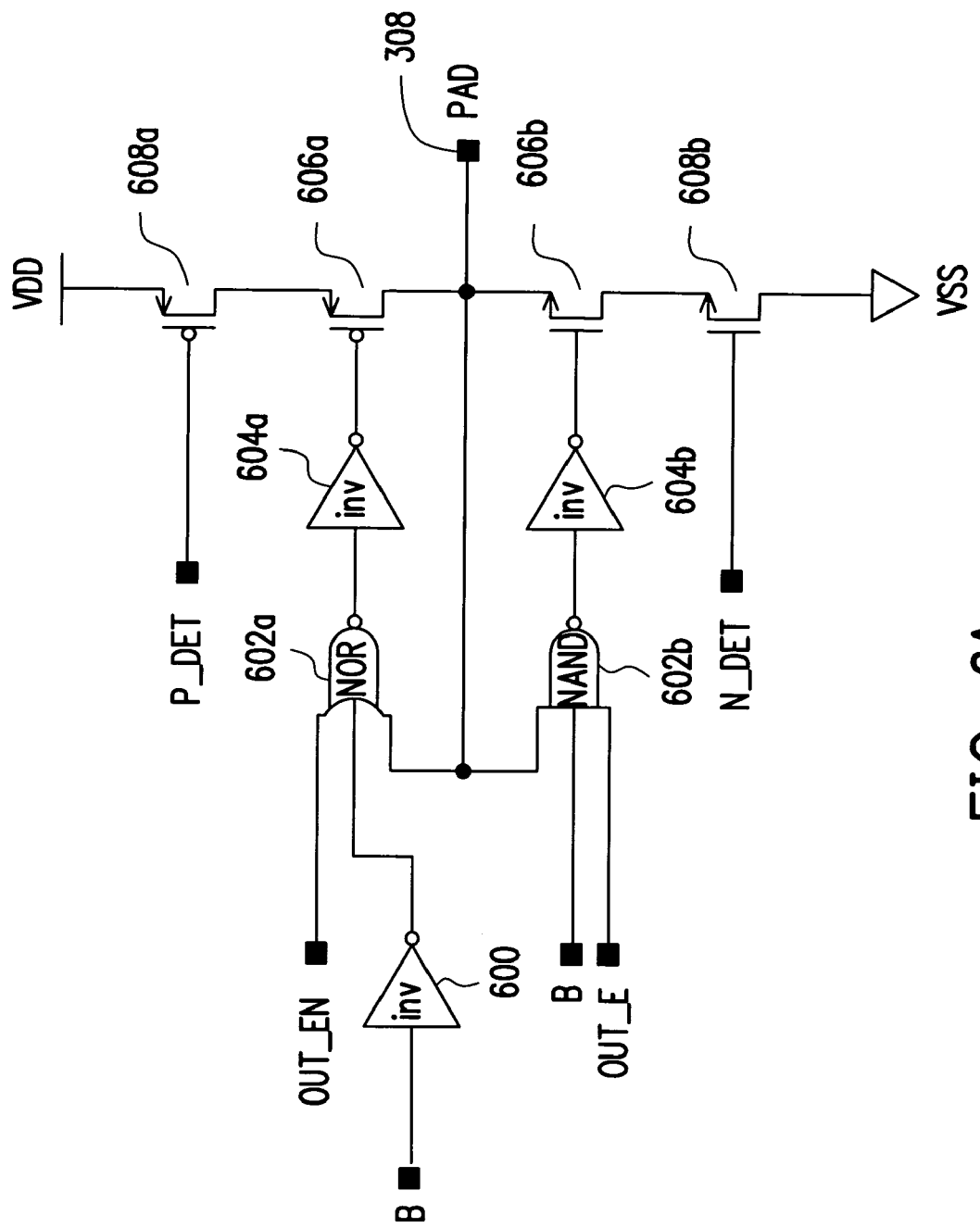
FIGS. 6A–6C are circuit diagrams, schematically illustrating the pre-driving circuit in FIG. 3, according to an embodiment of the invention.
Figure 6C:
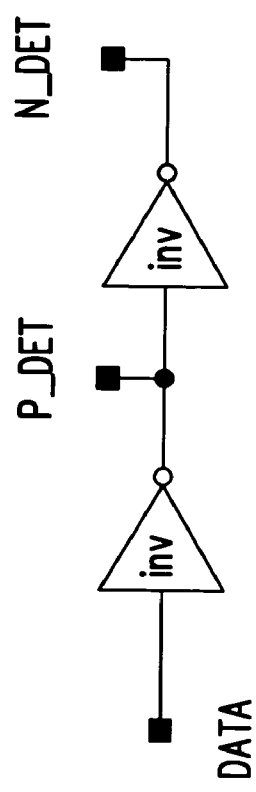
Figure 6B:
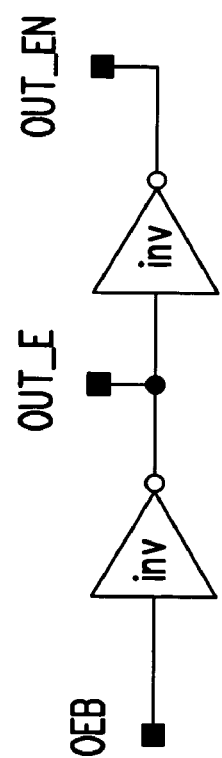

The pre-driving circuit 306 is also shown in FIGS. 6A–6C, as an example for circuit implementation. Before describing the better detail circuit in FIG. 6A, the control signals are branched as shown in FIGS. 6B and 6C. In FIG. 6B, the control signal OEB is branched into a control signal OUT_EN and another control signal OUT_E, which are complementary in logic states. Similarly, the data signal DATA is branched into the control signal P_DET for controlling the P-type MOS transistors and the control signal N_DET fort controlling the N-type MOS transistors. The branching circuits in FIG. 6B and FIG. 6C can simply be two inverters in cascade connection.

The pre-driving circuit 306 basically includes one part from P-type MOS devices and another part from N-type MOS devices. The pre-driving circuit 306, for example, includes a first inverter 600, receiving the output signal B from the pre-detecting circuit 302. An NOR logic gate 602a receives the control signal OUT_EN, an output from the inverter 600, and a feedback signal from the common node, which is from the I/O pad 308. Another inverter 604a receives an output from the NOR logic gate 602a. A P-type MOS transistor 606a has a gate coupled to an output terminal of the second inverter 604a, a first source/drain (S/D) electrode coupled to the I/O pad 308, and a second S/D electrode. Here, the MOS transistor has the source electrode and the drain electrode, which are interchangeable depending upon the actual operation. Another P-type MOS transistor 608a has a gate receiving the control signal P_DET, a first S/D electrode coupled to a system high voltage source VDD, and a second S/D electrode coupled with the second S/D electrode of the P-type MOS transistor 606a. A NAND logic gate 602b receives the control signal OUT_E, the output from the signal B, and the feedback signal from the I/O pad 308. Another inverter 604b receives an output from the NAND logic gate 602b. An N-type MOS transistor 606b has a gate receiving an output from the inverter 604b, a first S/D electrode coupled to the I/O pad 308, and a second S/D electrode. Another N-type MOS transistor 608b has a gate receiving the control signal N_DET, a first S/D electrode coupled to a system low voltage source VSS, such as ground, and a second S/D electrode coupled with the second S/D electrode of the N-type MOS transistor 606b.

Figure 7:
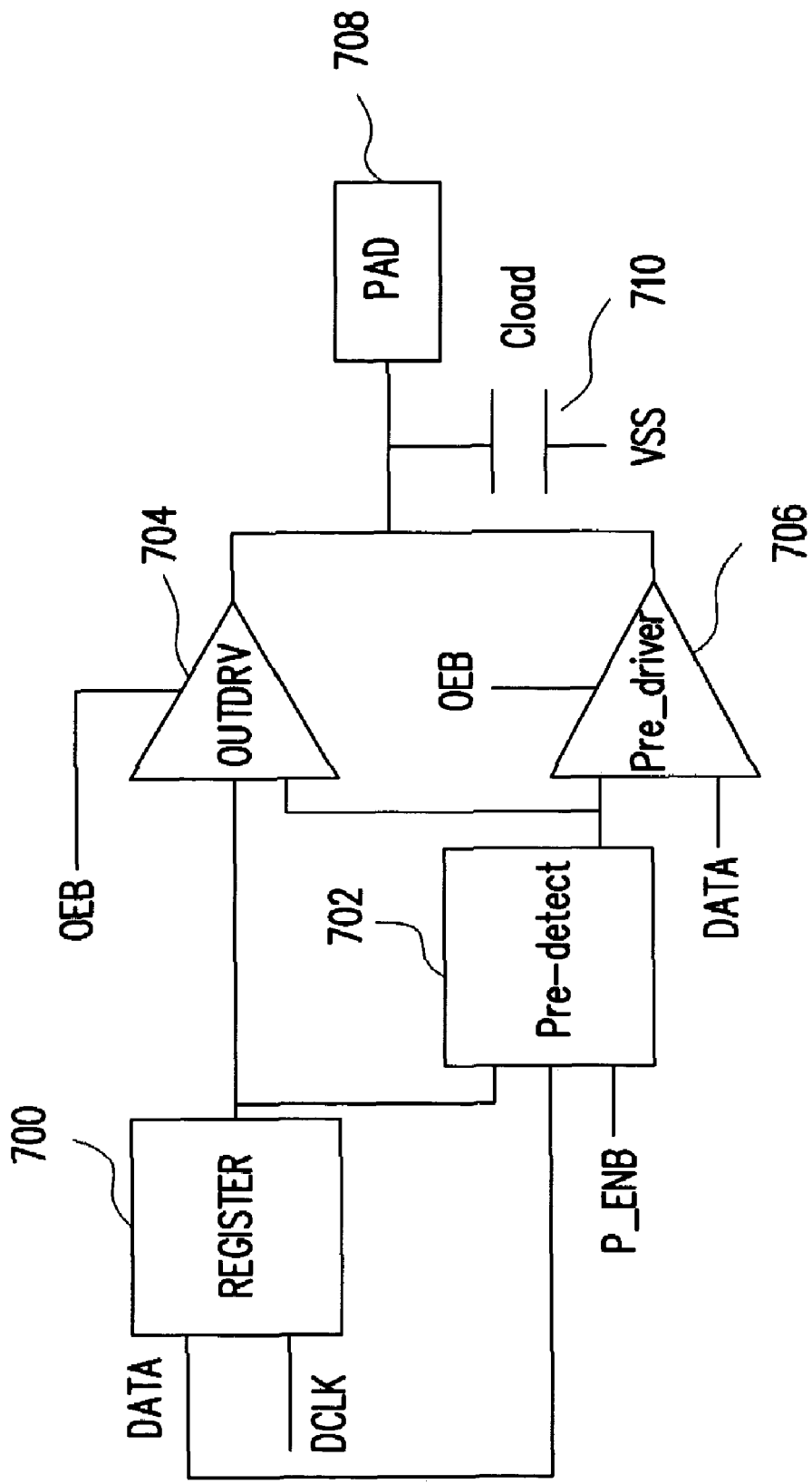
FIG. 7 is block diagram, schematically illustrating the memory-card driving circuit for driving multiple I/O pads in a memory card, according to another embodiment of the invention.

Alternatively, the memory-card driving circuit, as shown in FIG. 3, can be modified into the circuit shown in FIG. 7.

In FIG. 7, the memory-card driving circuit may include a register 700, a pre-detecting circuit 702, an output driving circuit (OUTDRV) 704, and a pre-driving circuit 706. In addition, an I/O pad 708 is coupled to the output terminals of the output driving circuit (OUTDRV) 704 and the pre-driving circuit 706. However, a load capacitor 710 and a circuit load impedance (not shown) is between the pad 308 and a system low voltage source, such as a ground voltage VSS.

Figure 8A:
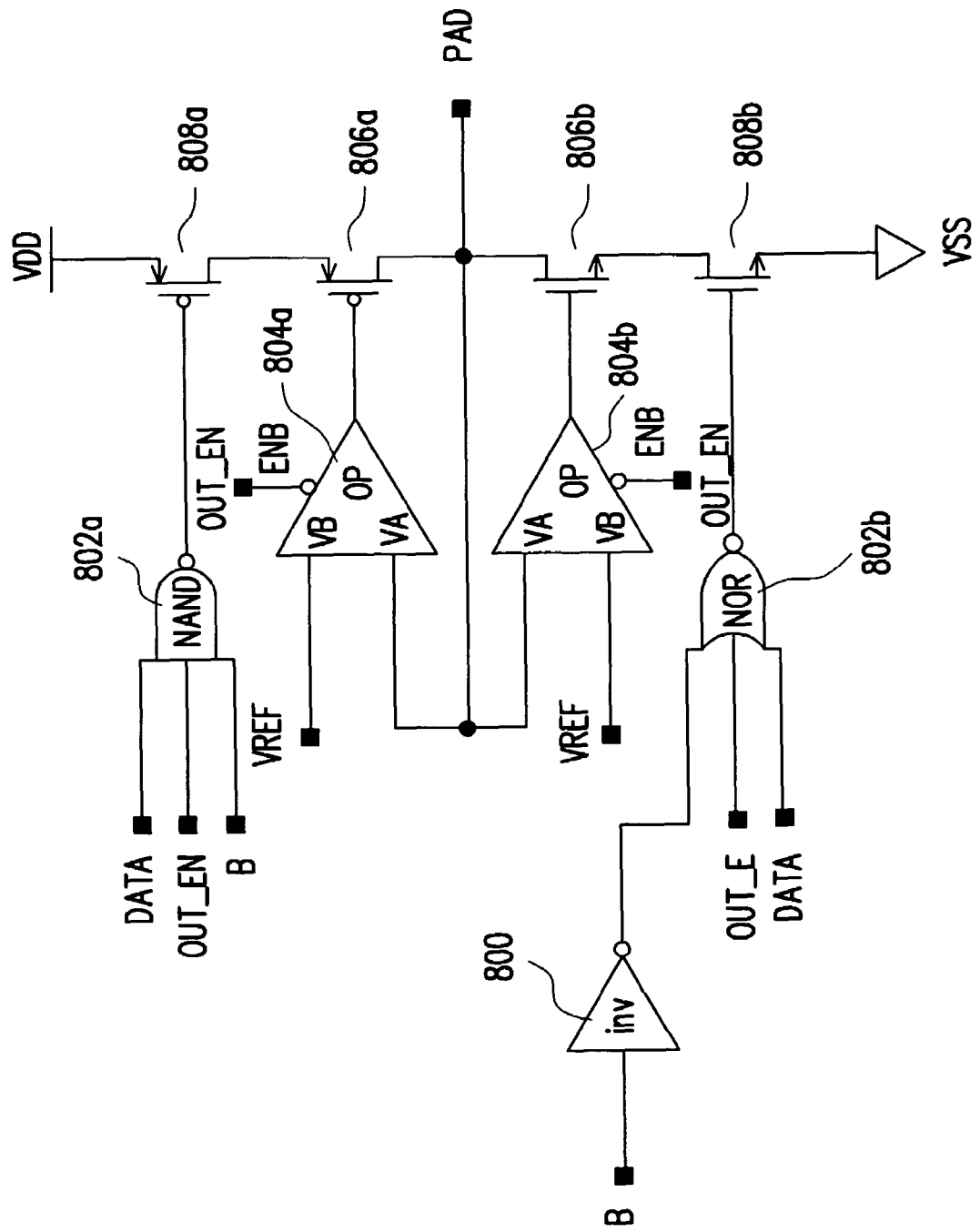
FIGS. 8A–8B are circuit diagrams, schematically illustrating the pre-driving circuit in FIG. 7, according to an embodiment of the invention.
Figure 8B:
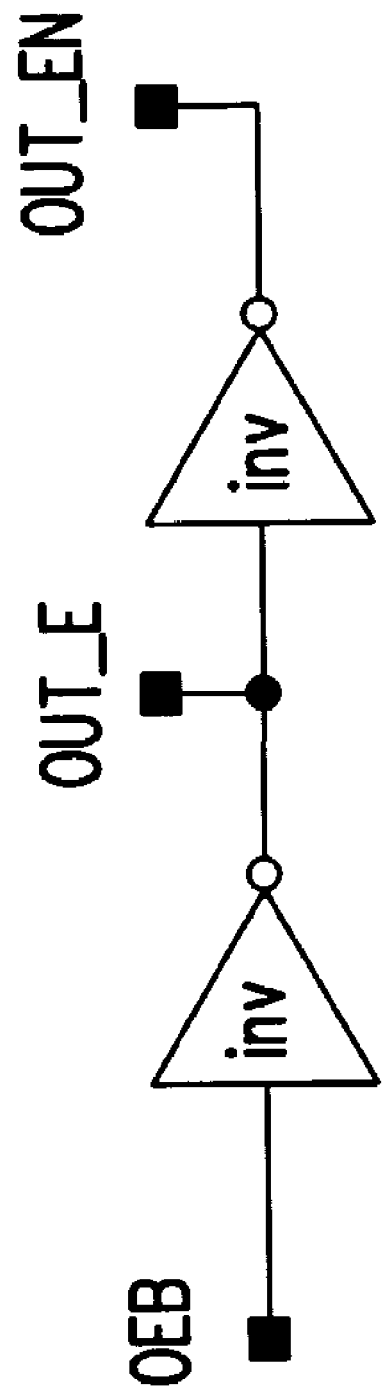

In this example, the output signal from the pre-detecting circuit 702 is also fed to the output driver 704. For this design, the circuit for pre-driving circuit 706 may be designed as shown in FIGS. 8A–8B.

In FIG. 7, the pre-driving circuit 706 receives the signal B from the pre-detecting circuit 702. In FIG. 8A, the pre-driving circuit 706 also receives the control signal OEB, which is branched into two complementary control signals OUT_E and OUT_EN by a way, for example, shown in FIG. 8B. An NAND logic gate 802a receives the control signal OUT_EN, signal DATA and the signal B. An operational amplifier (OP) 804a has an input terminal VB receiving a reference signal VREF, while a second input terminal VA coupled to the I/O pad PAD. A first P-type MOS transistor 806a has a gate coupled to the output terminal of the OP 804a, a first S/D electrode coupled to the I/O pad PAD, and a second S/D electrode. A second P-type MOS transistor 808a has a gate coupled to an output terminal of the NAND logic gate 802a, a first S/D electrode coupled to a system high voltage source VDD, and a second S/D electrode coupled with the second S/D electrode of the first P-type MOS transistor 806a.

For the N-type MOS devices in the pre-driving circuit, it includes a NOR logic gate 802b receives the control signal OUT_E, signal DATA, and the output from the inverter 800. The inverter 800 receives the signal B. Another operational amplifier 804b has a first input terminal VA coupled to the PAD, a second input terminal VB receiving the reference signal. A first N-type MOS transistor 806b has a gate coupled to the output terminal of the OP 804b, a first S/D electrode coupled to the PAD, and a second S/D electrode. A second N-type MOS transistor 808b has a gate coupled to an output terminal of the NOR logic gate 802b, a first S/D electrode coupled to the system low voltage source VSS, and a second S/D electrode coupled with the second S/D electrode of the first N-type MOS transistor 806b.

The invention have achieved several advantages at least as follows:

With the pre-detect circuit, it can reduce the output transient glitch, in order to minimize the transient current on I/O driver. The pre-detecting circuit can decide the on/off state for the pre-driving circuit. The pre-driving circuit can keep the output at the exist state (TTL level) for getting a maximum hold time, but the trend is applied to next coming data. The invention provides a first stage driving capability and the level detection circuit to reduce IO transient current and speed up IO transient time.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A memory I/O driving circuit, suitable for use to drive multiple memory cards or multiple I/O in a memory card, the memory I/O driving circuit comprising:
    a register, receiving a new-coming data and a delayed clock, and exporting a current-existing data, wherein the delayed clock has a delay with respect to a clock;
    a pre-detecting circuit, receiving the current-existing data, the new-coming data, and a pre-enable signal and exporting an output signal, wherein the current-existing data is compared with the new-coming data, and the output signal indicates a disable state if the two data are the same, otherwise the output signal indicates an enable state, wherein the pre-enable signal is also used to enable or disable the pre-detecting circuit;
    an output driving circuit, receiving the current-existing data and an enabling signal, and exporting a first output signal; and
    a pre-driving circuit, receiving the output signal of the pre-detecting circuit, the new-coming data, and an enable control signal, and exporting a second output signal,
    wherein the first output signal and the second output signal are sent to a common node.

2. The memory I/O driving circuit of claim 1, wherein the output driving circuit also receives the output signal from the pre-detecting circuit to enable or disable the output driving circuit.

3. The memory I/O driving circuit of claim 1, wherein when the pre-detecting circuit is disabled, the pre-detecting circuit is at a high-impedance state.

4. The memory I/O driving circuit of claim 1, wherein the pre-detecting circuit comprises:
    an XOR logic gate receiving the current-existing data and the new-coming data for comparison; and
    an AND logic gate, receiving an output from the XOR logic gate and the pre-enable signal and exporting an output signal.

5. The memory I/O driving circuit of claim 1, wherein the pre-detecting circuit comprises:
    an XOR logic gate or an XNOR logic gate, receiving the current-existing data is compared with the new-coming data; and
    an AND logic gate, receiving an output from the XOR logic gate and the pre-enable signal and exporting an output signal.

6. The memory I/O driving circuit of claim 1, wherein the pre-driving circuit comprises:
    a first inverter, receiving the output signal from the pre-detecting circuit;
    a first branching circuit, receiving the enable control signal and exporting a first p-type control signal and a first n-type control signal;
    a second branching circuit, receiving the new-coming data and exporting a second p-type control signal and a second n-type control signal;
    a NOR logic gate, receiving the first p-type control signal, an output from the first inverter, and a feedback signal from the common node;
    a second inverter, receiving an output from the NOR logic gate;
    a first P-type MOS transistor, having a gate receiving an output from the second inverter, a first source/drain (S/D) electrode coupled to the common node, and a second S/D electrode;
    a second P-type MOS transistor, having a gate receiving the second p-type control signal, a first S/D electrode coupled to a system high voltage source, and a second S/D electrode coupled with the second S/D electrode of the first P-type MOS transistor;

a NAND logic gate, receiving the first n-type control signal, the new-coming data, and the feedback signal from the common node;

a third inverter, receiving an output from the NAND logic gate;

a first N-type MOS transistor, having a gate receiving an output from the third inverter, a first S/D electrode coupled to the common node, and a second S/D electrode; and a second N-type MOS transistor, having a gate receiving the second n-type control signal, a first S/D electrode coupled to a system low voltage source, and a second S/D electrode coupled with the second S/D electrode of the first N-type MOS transistor.

7. The memory I/O driving circuit of claim 1, wherein the pre-driving circuit comprises:

a branching circuit, receiving the enable control signal and exporting a first-type control signal and a second-type control signal;

an NAND logic gate, receiving the first-type control signal, the new-coming data, and an output from the pre-detecting circuit;

a first operational amplifier (OP), having a first input terminal receiving a reference signal, a second input terminal coupled to the common node, and an output terminal;

a first P-type MOS transistor, having a gate coupled to the output terminal of the first OP, a first source/drain (S/D) electrode coupled to the common node, and a second S/D electrode;

a second P-type MOS transistor, having a gate coupled to an output terminal of the NAND logic gate, a first S/D electrode coupled to a system high voltage source, and a second S/D electrode coupled with the second S/D electrode of the first P-type MOS transistor;

an inverter, receiving the output from the pre-detecting circuit;

an NOR logic gate, receiving the second-type control signal, the new-coming data, and an output from the inverter;

a second operational amplifier (OP), having a first input terminal coupled to the common node, a second input terminal receiving the reference signal, and an output terminal;

a first N-type MOS transistor, having a gate coupled to the output terminal of the second OP, a first source/drain (S/D) electrode coupled to the common node, and a second S/D electrode; and a second N-type MOS transistor, having a gate coupled to an output terminal of the NOR logic gate, a first S/D electrode coupled to a system low voltage source, and a second S/D electrode coupled with the second S/D electrode of the first N-type MOS transistor.

8. The memory I/O driving circuit of claim 7, wherein the output driving circuit also receives the output signal from the pre-detecting circuit to enable or disable the output driving circuit.

9. The memory I/O driving circuit of claim 1, wherein the common node is coupled to an I/O pad.

* * * * *